United States Patent [19]

Kubach et al.

[11] 4,085,379
[45] Apr. 18, 1978

[54] AMPLIFIER FOR FLOATING VOLTAGE SOURCE

[75] Inventors: Hans Kubach, Munchigen; Peter Zieher, Markgroningen, both of Germany

[73] Assignee: Robert Bosch GmbH, Stuttgart, Germany

[21] Appl. No.: 776,084

[22] Filed: Mar. 9, 1977

[30] Foreign Application Priority Data

Mar. 10, 1976 Germany ............................ 2609841

[51] Int. Cl.$^2$ .......................... H03F 3/45; H03F 1/34
[52] U.S. Cl. ...................................... 330/69; 330/85; 330/104; 330/112; 330/260
[58] Field of Search ................... 330/28, 30 D, 69, 85, 330/103, 104, 112; 219/499, 501; 307/310; 328/3

[56] References Cited

U.S. PATENT DOCUMENTS

| | | | |
|---|---|---|---|
| 3,088,073 | 4/1963 | Newbold et al. | 328/3 |
| 3,088,076 | 4/1963 | Burwen | 330/103 X |
| 3,430,152 | 2/1969 | Walsh | 330/69 |

Primary Examiner—James B. Mullins
Attorney, Agent, or Firm—Flynn & Frishauf

[57] ABSTRACT

A differential amplifier is arranged to amplify faithfully the voltage produced by an ungrounded voltage source to provide the amplified result as a voltage in relation to a reference (ground) voltage. Errors resulting from leakage resistances between the ungrounded voltage source and ground are avoided by providing an inverting amplifier responsive to the output voltage, which draws, through a resistance, a current from a terminal of the voltage source which is proportional to the output voltage of the differential amplifier. This causes a shift of the potential of the voltage source in the direction towards the reference voltage. Optimum results are obtained when the shift is such that the variations in the voltage source being observed are caused to become balanced in relation to the reference potential. As applied to a thermocouple voltage source located in a furnace or engine, the circuit can be made to become balanced when there is a small residual current through the thermocouple, so that a fracture of the thermocouple will produce an immediately recognizable response.

7 Claims, 2 Drawing Figures

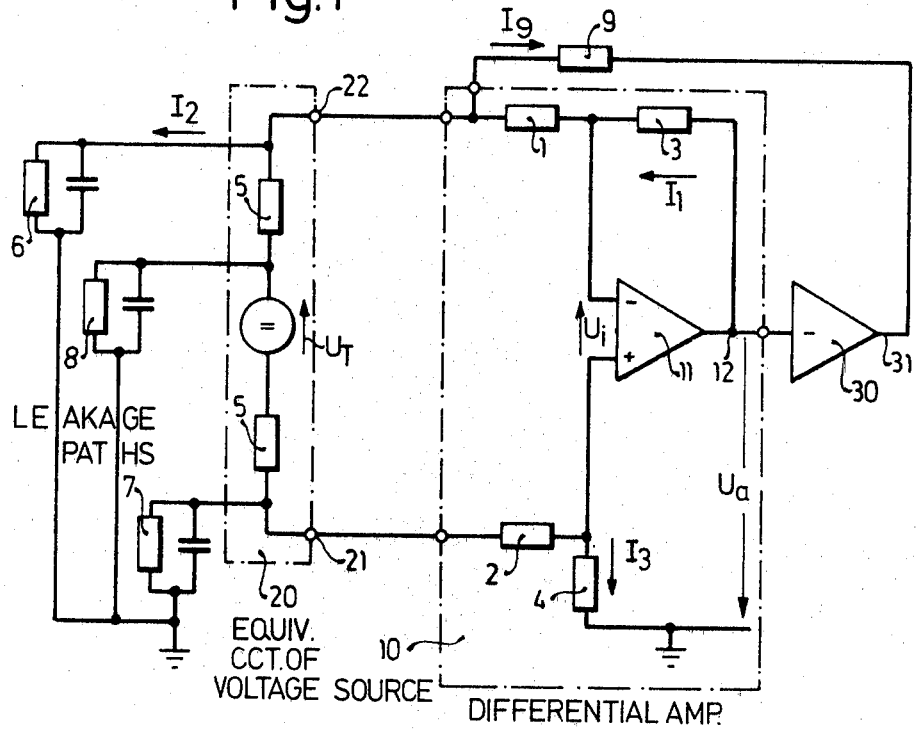
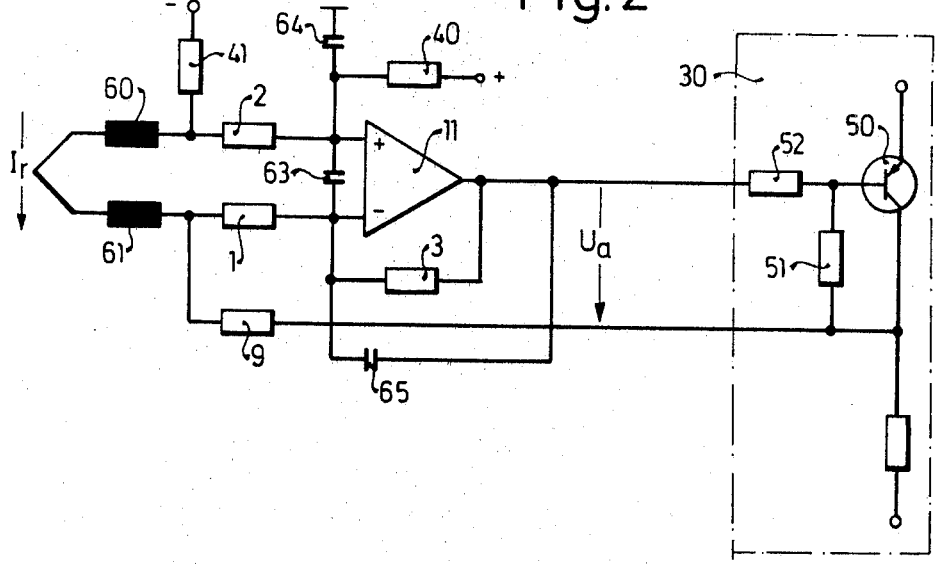

AMPLIFIER FOR FLOATING VOLTAGE SOURCE

This invention relates to a circuit for amplifying a voltage which is produced by a voltage source that is not fixed to a reference potential such as ground but is instead "floating", such as the voltage produced by a thermocouple in a combustion chamber, for example.

The voltage of such "floating" voltage sources is commonly amplified for measurement purposes by means of a differential amplifier to which the voltage to be amplified is supplied to the two amplifier inputs through series input resistances, the differential amplifier making available a voltage between an output terminal and a reference potential such as local ground which, is an amplification of the floating source voltage. In the measurement and amplification of a voltage of a galvanically floating voltage source with a potential that lies high on one side of reference potential such as local ground, problems arise because the values of the leakage resistances and capacitances to ground cannot be determined precisely beforehand and, moreover, can change very strongly with time and with temperature. These problems must be particularly carefully examined in cases in which voltage of the order of microvolts produced by a thermocouple or a similar thermal sensor is to be amplified, because in this particular case the insulation resistance sinks down into the range of magnitudes in the neighborhood of 20,000 ohms, for example in the case of thermal sensors located in a gas turbine. The errors produced by these leakage resistances could be at least partly eliminated if the thermocouple can be connected galvanically with the reference potential, but this is not possible in all cases of interest and, furthermore, when it is possible it can give rise to other errors by the formation of ground loops, particularly if the amplifier and the thermal sensor are spaced away from each other.

It is an object of the present invention to provide a circuit of the greatest possible simplicity by which the errors produced by leakage resistances can be so far as possible eliminated in the amplification of the voltage output of a galvanically floating voltage source.

SUMMARY OF THE INVENTION

Briefly, means are provided for shifting the potential of the voltage source in the direction towards reference potential and preferably for shifting it until its output voltage has a symmetrical relation to reference potential, by means of a current proportional to the output voltage of the differential amplifier, which current is caused to flow over one of the series input resistors of the differential amplifier.

Whereas in the usual feedback amplifiers utilized for similar measurements the potential of the d-c voltage source is at about the half value of the output voltage, so that relatively high leakage currents flow through the leakage resistances, these leakage currents are substantially reduced or entirely eliminated by the potential shift produced in accordance with the present invention, a shift equivalent to a virtual balancing out or nulling operation, particularly if in accordance with the preferred practice of the invention already mentioned, the potential of the voltage source is so shifted that its voltage is balanced with respect to reference potential.

The basic principle of the invention lends itself to a particularly simple practical embodiment by the provision of an inverting amplifier with its input connected to the output of the differential amplifier and its output connected through a resistor with one terminal of the voltage source.

Preferably the differential amplifier is constituted by an operational amplifier with feedback to its inverting input, and the resistor connected to the output of the additional inverting amplifier is connected to that terminal of the voltage source which is connected to the input resistance that leads to the inverting input of the differential amplifier. In such a circuit no more current will flow through the thermal sensor when an exact balance is reached, so that the input resistance of the differential amplifier rises greatly whereby, additionally, the advantage is obtained that the errors resulting from the internal resistance of the voltage source are reduced.

The invention is further described by way of example with reference to the accompanying drawing, in which:

FIG. 1 is a basic diagram for explanation of the principle of the invention; and FIG. 2 is a circuit diagram of an embodiment that has been successfully operated.

The portion of the circuit diagram of FIG. 1 within the rectangle 10 is a differential amplifier constituted by an operational amplifier 11, the series input resistors 1 and 2 respectively for the inverting and non-inverting inputs of the operational amplifier, a feedback resistor 3 and balance resistor 4 of a value corresponding to that of the feedback resistor 3, so that common mode errors are substantially eliminated in this amplifier. The rectangular block 20 contains the equivalent circuit of the voltage source to be measured. This voltage source has an internal resistance 5 which, for symmetry reasons, is subdivided into two resistances in the equivalent circuit.

It can be seen from FIG. 1 that the balance resistor 4 is connected at one end to the reference potential shown in the usual way by a ground symbol, with reference to which the output voltage provided at the output terminal 12 of the operational amplifier is exerted. This output voltage is designated $U_a$.

The voltage source 20 is floating with respect to the reference potential, because its terminals 21 and 22 are connected with the reference potential through leakage resistances 6 and 7. When a thermocouple is acting as this direct current voltage source, it may be, and generally is, necessary to take account also of the leakage resistance 8 and the corresponding capacity to ground from the junction of the two elements of the thermocouple pair.

In general it should also be kept in mind that the potential of the voltage source, the unloaded or idle voltage designated $U_T$, tends to lie at a level quite far removed from reference potential. Such a voltage source is commonly referred to as a source galvanically floating in relation to reference potential or, more commonly, floating with respect to ground.

The circuit as so far described is in principle already known. Without more it has the disadvantages already mentioned, because currents flow through leakage resistances and thus falsify the measurement. In order to avoid this disadvantage, an inverting amplifier 30 has its input connected to the output 12 of the operational amplifier 11 and its output 31 connected through a resistor 9 to the terminal 22 of the voltage source 20. A current can be drawn off through this circuit branch that is proportional to the output voltage of the operational amplifier 11.

The basic principle of the invention can best be explained with reference to a few calculations in which first a circuit arrangement lacking the inverting amplifier 30 and the resistance 9 is considered. For simplification of the calculation it will be assumed that the operational amplifier 11 has a very high idling or open circuit amplification and that its input resistance is likewise very high, so that the voltage designated $U_i$ in the diagram which appears between the inputs of the operational amplifier is negligibly small. Furthermore it will be assumed for the purpose of the calculation that the leakage resistances 7 and 8 are infinitely high, so that in the calculation only the value of the leakage resistance 6 needs to be taken into account. Finally, the simplification will be assumed that there is no voltage difference between the reference potential in the neighborhood of the voltage source indicated by the ground symbol at the left of the diagram and the reference potential at the differential amplifier indicated by the ground symbol within the differential amplifier block 10.

Under these assumptions four simultaneous equations can be set up in terms of the currents indicated on the diagram in accordance with the loops and nodes of the circuit, utilizing for simplification of the equations the designation $R_1$ for the equal series input resistors 1 and 2 and the designation $R_3$ for the equal feedback and balancing resistors 3 and 4. These equations are equations (1) through (4) listed in the annexed table.

Equation (1) describes the circuit around the loop including the output voltage $U_a$, the feedback resistor 3, the disregarded input voltage $U_i$ of the operational amplifier 11 and the balancing resistor 4. Equation (2) forms the sum of the partial voltages that appear across the internal resistance 5 of the voltage source and across the two series input resistors 1 and 2 as well as the unloaded voltage $U_T$ of the source. The input voltage of the operational amplifier is again neglected. Equation (3) describes a loop of which the partial voltages are given by the output voltage and the partial voltages appearing across the resistors 1 and 3 and across the leakage resistance 6. In equation (4) the sum of the currents for the terminal 22 of the voltage source is set forth.

From this system of equations there can be derived the expression set forth in equation (5) by determining calculation of the output voltage $U_a$ as a function of $U_T$. The denominator of the fraction in equation (5) can be expanded to give the result expressed in equation (6) stating a more evidently meaningful relation between the output voltage $U_a$ and the idling or unloaded voltage of the voltage source.

It is clear from equation (6) that the output voltage depends on the magnitude of the leakage resistance $R_6$. Since this resistance varies with temperature and time, the output voltage of the amplifier is subject to a similar variation, so that with this circuit arrangement the voltages in the microvolt range produced by a thermocouple cannot be observed accurately enough over a long period of time. The influence of this leakage resistance $R_6$ can be made clearer, for the simplification of explanation, by means of a numerical example. In this numerical example the aggregate internal resistance of the voltage source $R_5$ is set equal to 10 ohms, the series input resistances are assumed to be 1000 ohms each and the feedback and balancing resistors are considered to be 200,000 ohms. Equation (7) is then obtained for the condition in which $R_6 = 0$. Utilizing this equation with the assumed numerical values substituted therein $U_a$ is found to be equal to 199.99 $U_T$.

When $R_6$ goes to infinity there is obtained from equation (6) after division by $R_6$ and taking the limit, the relation set forth in equation (8). This equation is, for the numerical values above mentioned, $U_a = 199.00\ U_T$.

Similarly, for $R_6 = 20,000$ ohms, substitution in equation (6) yields the result $U_a = 199.44\ U_T$.

It is thus seen that the influence of the leakage resistance $R_6$ cannot be neglected if highly precise measurements are to be carried out with the circuit. The theoretically correct value which is given by the quotient of the resistance $R_3$ with respect to the input resistance $R_1$, and is equal to 200 in the case of the above-assumed data. This comes closest to the value above calculated for $R_6 = 0$.

In the following analysis, there will now be considered the circuit according to the present invention, in which there is drawn off from the terminal of the voltage source 22, by means of the resistor 9 and the inverting amplifier 30, a current $I_9$ that is made to be of such a magnitude that the voltage drop across the resistances 1 and 3 by the current $I_1$ corresponds to the output voltage $U_a$. In this manner the terminal 22 of the voltage source 20 is at reference potential, so that no more leakage current can flow through the leakage resistance 6. In this case there is obtained the system of equations set forth in the table in the equations (9) through (12), from which a relation describing $U_a$ as the function of $U_T$ can be obtained that is set forth in equation (13) of the table.

It can be seen that the results obtained are the same as for the case in which the voltage source is galvanically connected to reference potential. With the magnitudes provided in the above-mentioned numerical example, there would be obtained as the amplification factor the value 199.99.

For $R_5 = 0$, there is obtained from equation (13) the theoretical value for the voltage amplification which is the quotient of the feedback resistance with respect to the input series residence and, of course, this can also be obtained from equation (8). It is to be noted, however, that in equation (8) the internal resistance of the voltage source is added to the series input resistance of the operational amplifier, whereas in accordance with equation (13) this internal resistance $R_5$ is added to a resistance that is much larger in comparison to the series resistance and to the series resistances as well, so that in the embodiment of the invention even the errors resulting from a presence of the internal resistance are reduced.

From the equation system (9)–(13) it follows that the current $I_9$ drawn from the voltage source at the terminal 22 depends merely on the magnitude of the resistances $R_1$ and $R_3$ and on the output voltage $U_a$. It is thus shown that this current can be directly derived from the output voltage.

In the explanatory calculations only the effect of the leakage resistance $R_6$ was taken into account. The influence of the other leakage resistances 7 and 8 can be separately calculated and then the actual situation can be worked out by the superposition principle. The result is in principle nothing surprising, namely, the output voltages are found to be dependent on these leakage resistances and accordingly vary correspondingly with the behavior of these resistances resulting from temperature fluctuations and from aging, if the potential of the voltage source is not shifted to the reference potential in accordance with the invention.

Occasion must be taken to point out that optimum results are actually obtained if care is taken to provide that variations in the voltage $U_T$ are balanced in relation to the reference potential. Thus an increase of accuracy is obtained if the potential of the voltage source relative to reference potential is reduced, because the leakage currents over the leakage resistances are reduced in corresponding amount.

In the example illustrated in FIG. 1, the current $I_9$ dependent in value on the output voltage $U_a$ is drawn from the circuit point 22. This current could also be drawn from the circuit point 21, but the voltage source would then be loaded by this current and an error would arise from the voltage drop produced across the internal resistance.

In FIG. 2 the circuit represented in FIG. 1 is made more specific. For fixing the output voltage range of the operational amplifier 11, the non-inverting input of the operational amplifier is biased by a resistor 40. The current produced by this bias voltage is drawn off again through the resistor 41, so that the thermocouple will not be loaded by it. The inverting amplifier 30 is constituted by a transistor 50 that is driven in the collector circuit and has its working point set by the resistance 51. The output voltage of the operational amplifier is supplied over the resistance 52 to the base electrode of the transistor 50.

In order to reduce to a minimum the common mode errors in this circuit, the value of the resistance 41 is matched to that of the resistance 9.

The chokes 60 and 61, which are of equal magnitude and are provided in series with the inputs of the differential amplifier ahead of the series input resistors, have the function of filtering out both common mode and differential mode disturbances. A further filtering of differential mode disturbances is provided by the capacitor 63 which is connected between the inverting and non-inverting inputs of the operational amplifier. Finally, the capacitor 64 connected between the non-inverting input and reference potential and another capacitor 65 in parallel to the feedback resistance are provided. It is basically important for a good suppression of common mode effects that the values of the capacitors 64 and 65 should be the same.

The arrow designated $I_r$ in FIG. 2 indicates that a residual current $I_r$ can be allowed to flow through the thermocouple. This residual current can be compensated so that its error-producing effect is negligibly small. The possibility is thereby provided to detect a fracture of the thermocouple, because the output voltage of the operational amplifier reaches the saturation voltage as soon as this residual current is interrupted.

Although the invention has been described with reference to a particular illustrative embodiment, variations and modifications are possible within the inventive concept.

TABLE OF EQUATIONS $$-U_a + R_3 \cdot I_1 + R_3 \cdot I_3 = 0 \tag{1}$$
$$R_1 \cdot I_1 + (R_1 + R_5) \cdot I_3 = U_T \tag{2}$$
$$-U_a + (R_1 + R_3)I_1 + R_6 \cdot I_2 = 0 \tag{3}$$
$$-I_1 + I_2 + I_3 = 0 \tag{4}$$
$$U_a = U_T \frac{(R_1 + R_3 + 2R_6) \cdot R_3}{R_1 \cdot R_5 + R_5 \cdot R_6 + R_1^2 + R_1 R_3 + 2R_1 \cdot R_6} \tag{5}$$
$$U_A = U_T \frac{(R_1 + R_3 + 2R_6) \cdot R_3}{(R_1 + R_3 + 2R_6)(R_1 + R_5) - R_3 \cdot R_5 - R_6 \cdot R_5} \tag{6}$$
$$U_a = U_T \frac{(R_1 + R_3) \cdot R_3}{(R_1 + R_3)(R_1 + R_5) - R_3 \cdot R_5} \tag{7}$$

TABLE OF EQUATIONS-continued $$U_a = U_T \cdot \frac{2R_3}{2R_1 + R_5} \tag{8}$$
$$-U_a + R_3 \cdot I_1 + R_3 \cdot I_3 = 0 \tag{9}$$
$$I_1 - I_9 - I_3 = 0 \tag{10}$$
$$-U_a + (R_1 + R_3) I_1 = 0 \tag{11}$$
$$(R_3 + R_1 + R_5) I_3 = U_T \tag{12}$$
$$U_a = \frac{R_3(R_1 + R_3)}{R_1(R_1 + R_3 + R_5)} \tag{13}$$

We claim:

1. Circuit for amplification of the voltage of a voltage source that is electrically floating in relation to a reference potential, comprising, in combination:
   a differential amplifier having two inputs and a single output, said inputs being connected through series input resistances to the voltage to be amplified as provided by said voltage source and said output making available an amplification of the voltage of said source as a voltage between the output and said reference potential, and
   means for shifting the potential of said source (20) in the direction towards said reference potential exclusively by positive feedback around said differential amplifier that draws a current ($I_9$) through one of said series input resistances, which current is proportional to said voltage between said differential amplifier output and said reference potential.

2. Circuit as defined in claim 1, in which said shifting means is constituted as means for shifting the potential of said source (20) in such a way that the voltage ($U_T$) of said source is made symmetrical in relation to said reference potential.

3. Circuit as defined in claim 1, in which said shifting means includes an inverting amplifier (30) having its input connected to the output (12) of said differential amplifier and having its output connected through a resistance (9) with the terminal (22) of said voltage source (20) which is connected through one of said series input resistances to the inverting input of said differential amplifier.

4. Circuit as defined in claim 3, in which said differential amplifier is constituted by an operational amplifier (11) having an inverting and a non-inverting input and a feedback path between its output and its inverting input and in which said resistor (9) of said potential shifting means is connected to that terminal (22) of said voltage source (20) which is connected through one of said series input resistances (1) with the inverting input of said operational amplifier (11).

5. Circuit as defined in claim 4, in which said noninverting input of said operational amplifier (11) is also connected through a symmetry-providing resistance (40) to a source of voltage provided for limiting the the output voltage range of said operational amplifier, and in which, further, a circuit branch connection to the terminal (21) of said voltage source that is connected through one of said series input resistances to said noninverting input of said differential amplifier is provided for branching off the current produced by said source of range-limiting voltage.

6. Circuit as defined in claim 5, in which said voltage source is a source through which a residual current ($I_r$) normally flows which is capable of being compensated by said potential shifting means.

7. Circuit as defined in claim 1, in which choke means (60, 61) and capacitors (63, 64, 65) are provided for filtering both common mode and differential mode disturbances.

* * * * *